(12) United States Patent
Zhang et al.

(10) Patent No.: US 9,679,186 B2
(45) Date of Patent: Jun. 13, 2017

(54) CAPACITANCE DETECTING DEVICE FOR FINGERPRINT IDENTIFICATION AND FINGERPRINT IDENTIFICATION APPARATUS COMPRISING THE SAME

(71) Applicant: BYD COMPANY LIMITED, Shenzhen (CN)

(72) Inventors: Zibao Zhang, Shenzhen (CN); Jie Zhang, Shenzhen (CN); Yun Yang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 15/192,807

(22) Filed: Jun. 24, 2016

(65) Prior Publication Data

US 2016/0307019 A1 Oct. 20, 2016

Related U.S. Application Data

(63) Continuation of application No. PCT/CN2014/095134, filed on Dec. 26, 2014.

(30) Foreign Application Priority Data

Dec. 27, 2013 (CN) .......................... 2013 1 0740173
Dec. 27, 2013 (CN) ...................... 2013 2 0871000 U

(51) Int. Cl.
*G06K 9/00* (2006.01)
*G01R 27/26* (2006.01)

(52) U.S. Cl.
CPC ........ *G06K 9/0002* (2013.01); *G01R 27/2605* (2013.01)

(58) Field of Classification Search
USPC ................................................ 382/124–127
See application file for complete search history.

(56) References Cited

U.S. PATENT DOCUMENTS 6,330,145 B1 * 12/2001 Lepert ................ G06K 9/00053
361/220
6,555,888 B2 * 4/2003 Lepert ................ G06K 9/00053
257/415

(Continued)

FOREIGN PATENT DOCUMENTS

CN 1564189 A 1/2005
CN 101097598 A 1/2008

(Continued)

OTHER PUBLICATIONS

International Search Report and Written Opinion of the International Searching Authority for International Patent Application No. PCT/CN2014/095134 dated Mar. 25, 2015, 10 pages.

*Primary Examiner* — Alex Liew
(74) *Attorney, Agent, or Firm* — Alston & Bird LLP

(57) ABSTRACT

A capacitance detecting device for fingerprint identification and a fingerprint identification apparatus are provided. The device includes a conductive border; a detecting screen, comprising: a plurality of detecting units, in which each detecting unit includes: a first conductive layer, a second conductive layer, a third conductive layer and a fourth conductive layer; a detecting module, configured to charge a sensing capacitance between the first conductive layer and a finger in contact with the detecting screen and a feedback capacitance between the first conductive layer and the second conductive layer at a sampling stage, to control electric charges of the sensing capacitance and the feedback capacitance to transfer to an integrating capacitance between the third conductive layer and the fourth conductive layer at an integral stage, to measure a voltage variation of the integrating capacitance at the integral stage and to calculate the sensing capacitance according to the voltage variation.

11 Claims, 4 Drawing Sheets

(56) References Cited

U.S. PATENT DOCUMENTS

| | | | |
|---|---|---|---|
| 6,636,053 B1 | 10/2003 | Gozzini | |
| 6,681,033 B1 | 1/2004 | Yano et al. | |
| 7,127,089 B2 * | 10/2006 | Miyasaka | G06K 9/0002 |
| | | | 324/662 |
| 7,583,826 B2 * | 9/2009 | Nakamura | G06K 9/0004 |
| | | | 340/5.53 |
| 2001/0031074 A1 * | 10/2001 | Yamazaki | G06F 21/32 |
| | | | 382/124 |
| 2002/0054695 A1 * | 5/2002 | Bjorn | G06F 3/03547 |
| | | | 382/124 |
| 2003/0099380 A1 * | 5/2003 | Gozzini | G06K 9/0002 |
| | | | 382/124 |
| 2003/0165261 A1 * | 9/2003 | Johansen | G06K 9/0002 |
| | | | 382/124 |
| 2005/0073324 A1 | 4/2005 | Umeda et al. | |
| 2005/0078856 A1 * | 4/2005 | Miyasaka | G06K 9/0002 |
| | | | 382/124 |
| 2005/0141048 A1 * | 6/2005 | Mizutani | G06K 9/0002 |
| | | | 358/474 |
| 2005/0226478 A1 | 10/2005 | Fujiyoshi | |
| 2008/0069413 A1 | 3/2008 | Riedijk et al. | |
| 2008/0079100 A1 | 4/2008 | Manansala | |
| 2009/0123039 A1 | 5/2009 | Gozzini | |
| 2009/0322700 A1 | 12/2009 | D'Souza et al. | |
| 2013/0271422 A1 | 10/2013 | Hotelling et al. | |

FOREIGN PATENT DOCUMENTS

| | | |
|---|---|---|
| CN | 101526988 A | 9/2009 |
| CN | 101727571 A | 6/2010 |
| CN | 101727575 A | 6/2010 |
| CN | 201716741 U | 1/2011 |
| CN | 202677425 U | 1/2013 |
| CN | 203102316 U | 7/2013 |
| CN | 203746088 U | 7/2014 |
| CN | 203964928 U | 11/2014 |
| WO | WO 01/59692 A1 | 8/2001 |

* cited by examiner

CAPACITANCE DETECTING DEVICE FOR FINGERPRINT IDENTIFICATION AND FINGERPRINT IDENTIFICATION APPARATUS COMPRISING THE SAME

CROSS REFERENCE TO RELATED APPLICATIONS

This application is a continuation of International Application No. PCT/CN2014/095134, filed Dec. 26, 2014, which claims the benefit of Chinese Patent Application Nos. 201310740173.2, filed Dec. 27, 2013 and 201320871000.X, filed Dec. 27, 2013, each incorporated by reference herein.

FIELD

The present disclosure relates to the field of electronic technology, and more particularly to a capacitance detecting device for fingerprint identification and a fingerprint identification apparatus comprising the capacitance detecting device for fingerprint identification.

BACKGROUND

During a typical process of fingerprint identification, a portion (i.e. a detecting panel) of a fingerprint sensor contacts with a finger. The detecting panel includes a plurality of small detecting units and one detecting unit can be called one detecting pixel, in which these detecting pixels can be distributed two-dimensionally. When fingerprinting, the finger is placed on the detecting panel. Because of the shape of the finger, a peak of the pattern is directly contacted with the detecting panel but a valley of the pattern is at a short distance from the detecting panel, in which the short distance is corresponding to a depth of the valley. If the short distance can be identified, the peak and the valley of the pattern can be distinguished, i.e. a fingerprint characteristic can be detected. Another way is to change an electric field distribution on a surface of the detecting panel by the finger, and further to detect the fingerprint characteristic.

The above-mentioned fingerprint detecting method may be implemented by a capacitance detecting method. The fingerprint detecting method based on this principle already has a variety of implementations. One of the implementations is to detect a capacitance formed between the finger and a top metal plate below the detecting panel to determine the fingerprint characteristic. Specifically, in the structure, one detecting pixel corresponds to one metal electrode and those metal electrodes are two-dimensionally distributed in the directions of a row and a column to constitute a two-dimensional detecting array as one plate for fingerprint detecting. At the same time, the finger placed on the detecting panel constitutes another plate corresponding to the two-dimensional detecting array due to a conductive characteristic of the finger, so a capacitance formed between the two plates is corresponding to the fingerprint characteristic. If the distance between the two plates corresponding to the peak is small then the capacitance is large, and vice versa for the valley. Therefore, the fingerprint characteristic can be determined by detecting the capacitance.

Another of the implementations is as follows: each detecting pixel includes two plates, and these plates are alternately arranged and located on different metal layers, and a fixed capacitance can be formed between these plates. The electric field distribution between these plates can be changed when the finger is placed on the detecting panel, and then the fixed capacitance also can be changed, so the peak and valley of the pattern can be distinguished, i.e. the fingerprint characteristic can be detected due to the different electric field distribution of the peak and valley.

With the fingerprint sensor implemented with a semiconductor sensing capacitor, a superstructure thereof facing the finger typically includes multiple conductive layers of metal and isolative layers between the conductive layers. The uppermost conductor layer is the fingerprint detecting plate corresponding to the finger. Capacitances formed between the conductive layers can be used as an integrating capacitance which is used for detecting fingerprint and formed between the finger and the uppermost conductor layer or can be used as parasitic capacitances. However, the accuracy of the fingerprint detecting can be affected by parasitic capacitances.

However, parasitic capacitances not only exist between the conductive layers, but also exist between detecting electrodes of the uppermost conductor layers, and between conductive layers and the ground. The fact that parasitic capacitances influence the accuracy of the fingerprint detecting manifests in two aspects: on the one hand, usually parasitic capacitances are parallel with the detecting capacitance, for example, an input signal is changed from $V_{in}$ to $V_{in}*C_f/(C_f+C_p)$, where $V_{in}$ represents the input voltage signal, $C_f$ represents the detecting capacitance formed by the finger, and $C_p$ represents parasitic capacitances, and parasitic capacitances $C_p$ is larger than the detecting capacitance $C_f$, which significantly reduces the accuracy of the fingerprint detecting; on the other hand, a noise from the substrate is usually coupled to the detecting capacitance by parasitic capacitances, which further reduces the accuracy of the fingerprint detecting.

SUMMARY

Embodiments of the present disclosure seek to solve at least one of the problems existing in the related art to at least some extent.

One objective of the present disclosure is to provide a capacitance detecting device for fingerprint identification, which increases the accuracy of the fingerprint detecting, effectively reduces the circuit noise, and significantly reduces the power consumption and the circuit area.

Another objective of the present disclosure is to provide a fingerprint identification apparatus.

According to a first aspect of the present disclosure, a capacitance detecting device for fingerprint identification is provided. The capacitance detecting device for fingerprint identification comprises a conductive border; a detecting screen, comprising: a plurality of detecting units, in which each detecting unit comprises a first conductive layer, a second conductive layer, a third conductive layer and a fourth conductive layer, in which a sensing capacitance is formed between the first conductive layer and a finger in contact with the detecting screen, a feedback capacitance is formed between the first conductive layer and the second conductive layer, an integrating capacitance is formed between the third conductive layer and the fourth conductive layer, and the finger is electrically connected with the conductive border when the finger is in contact with the detecting screen; a detecting module, configured to charge the sensing capacitance and the feedback capacitance at a sampling stage, to control electric charges of the sensing capacitance and electric charges of the feedback capacitance to transfer to the integrating capacitance at an integral stage, to measure a voltage variation of the integrating capacitance at the integral stage, and to calculate the sensing capacitance according to the voltage variation.

With the capacitance detecting device for fingerprint identification according to embodiments of the present disclosure, the detecting module charges the sensing capacitance and the feedback capacitance at the sampling stage, and measures and controls electric charges of the sensing capacitance and the feedback capacitance to transfer to the integrating capacitance at the integral stage, and then measures the voltage variation of the integrating capacitance at the integral stage and calculates the sensing capacitance according to the voltage variation to achieve fingerprint identification. Therefore, the capacitance detecting device for fingerprint identification according to embodiments of the present disclosure at least has the following advantages: (1) by changing the fingerprint signal to the digital capacitance signal to avoid a general front-end detecting circuit, the circuit scale is significantly reduced, and since the smaller the circuit scale is, the lower the noise and power consumption are, the capacitance detecting device for fingerprint identification has the higher detecting accuracy and the lower power consumption; (2) by keeping parasitic capacitances at a fixed potential via the operational amplifier, parasitic capacitances in the circuit does not affect the charge transferring, so it is possible to eliminate the effects of parasitic capacitances on the input signal and to eliminate the influence of the switching device on the detection accuracy, and thereby the detection accuracy is increased.

According to a second aspect of the present disclosure, a fingerprint identification apparatus is provided. The fingerprint identification apparatus comprises the capacitance detecting device for fingerprint identification according to the first aspect of the present disclosure.

With the fingerprint identification apparatus according to embodiments of the present disclosure, the detecting module charges the sensing capacitance and the feedback capacitance at the sampling stage, and measures and controls electric charges of the sensing capacitance and the feedback capacitance to transfer to the integrating capacitance at the integral stage, and then, measures the voltage variation of the integrating capacitance at the integral stage and calculates the sensing capacitance according to the voltage variation to achieve fingerprint identification. Therefore, the fingerprint identification apparatus according to embodiments of the present disclosure at least has the following advantages: (1) by changing the fingerprint signal to the digital capacitance signal to avoid a general front-end detecting circuit, the circuit scale is significantly reduced, and since the smaller the circuit scale is, the lower the noise and power consumption are, the fingerprint identification apparatus has the higher detecting accuracy and the lower power consumption; (2) by keeping parasitic capacitances at a fixed potential via the operational amplifier, parasitic capacitances in the circuit does not affect the charge transferring, so it is possible to eliminate the effects of parasitic capacitances on the input signal and to eliminate the influence of the switching device on the detection accuracy, and thereby the detection accuracy is increased.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
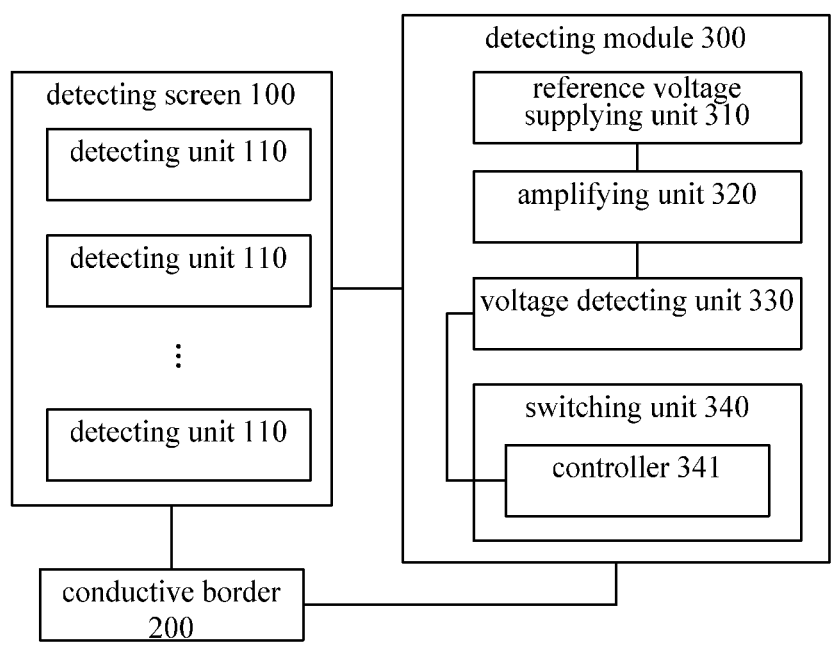
FIG. 1 is a block diagram of a capacitance detecting device for fingerprint identification according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise.

In the description of the present disclosure, it should be understood that, unless specified or limited otherwise, the terms "mounted," "connected," and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

In the following, a capacitance detecting device for fingerprint identification will be described in detail with reference to FIG. 1 to FIG. 4.

Figure 4:
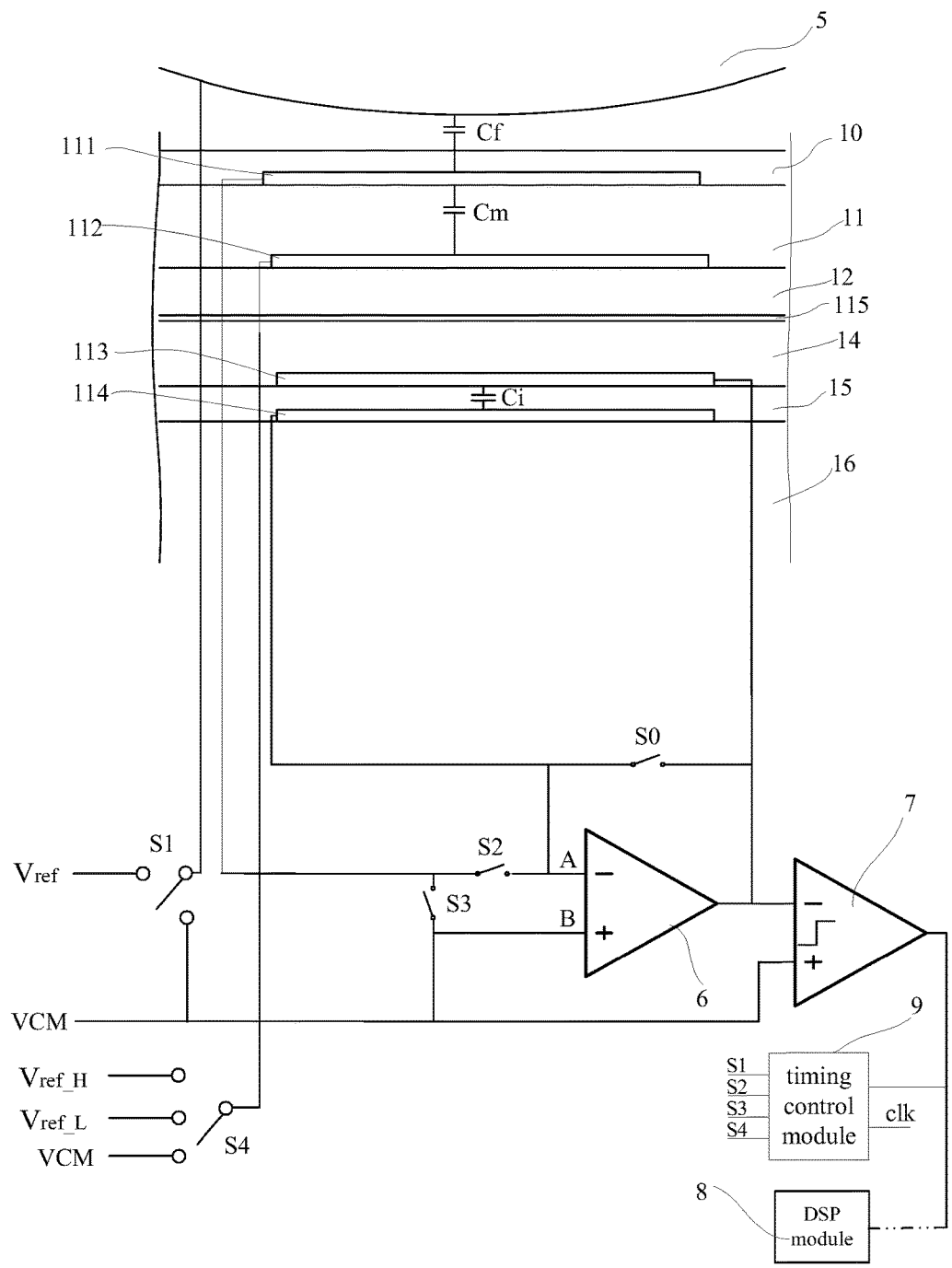
FIG. 4 is a schematic diagram of a capacitance detecting device for fingerprint identification according to another embodiment of the present disclosure.

As shown in FIG. 1, the capacitance detecting device for fingerprint identification includes a detecting screen 100, a conductive border 200 and a detecting module 300. The detecting screen 100 includes a plurality of detecting units 110, and each detecting unit 110 includes a first conductive layer 111, a second conductive layer 112, a third conductive layer 113 and a fourth conductive layer 114 as shown in FIG. 4. A sensing capacitance $C_f$ is formed between the first conductive layer 111 and a finger 5 in contact with the detecting screen 100, a feedback capacitance $C_m$ is formed between the first conductive layer 111 and the second conductive layer 112, an integrating capacitance $C_i$ is formed between the third conductive layer 113 and the fourth conductive layer 114. The finger 5 is electrically connected with the conductive border 200 when the finger 5 is in contact with the detecting screen 100. The conductive border 200 is electrically conductive as long as the conductive border 200 can be electrically connected with the finger 5 when the finger 5 is in contact with the detecting screen 100. Preferably, the conductive border 200 is made of a metal. The detecting module 300 is configured to charge the sensing capacitance $C_f$ and the feedback capacitance $C_m$ at a sampling stage, to control electric charges of the sensing capacitance $C_f$ and electric charges of the feedback capacitance $C_m$ to transfer to the integrating capacitance $C_i$ at an integral stage, to measure a voltage variation of the integrating capacitance $C_i$ at the integral stage, and to calculate the sensing capacitance $C_f$ according to the voltage variation.

In some embodiments, as shown in FIG. 4, the first conductive layer 111, the second conductive layer 112, the third conductive layer 113 and the fourth conductive layer 114 are parallel to the detecting plane of the detecting screen 100 respectively, in which the detecting plane is interpreted as a plane where the detecting screen 100 is located on. In other words, the first conductive layer 111, the second conductive layer 112, the third conductive layer 113 and the fourth conductive layer 114 can be sequentially stacked and are parallel to the detecting plane of the detecting screen 100 respectively.

In some embodiments, the conductive border 200 is different from the first conductive layer 111, the second conductive layer 112, the third conductive layer 113 and the fourth conductive layer 114 of each detecting units 110. Specifically, the first conductive layer 111, the second conductive layer 112, the third conductive layer 113 and the fourth conductive layer 114 are located inside the detecting screen 100 and are insulated from the outside, but the conductive border 200 is located outside the detecting screen 100 and surrounds the detecting screen 100. Since the finger 5 is conductive, the finger 5 is electrically connected with the conductive border 200 when the finger 5 is placed on the detecting screen 100, and a signal can be transmitted to the finger 5 via the conductive border 200. It should be understood that, the conductive border 200 is convex relative to a surface of the detecting screen 100 to be in full contact with the finger 5.

Figure 2:
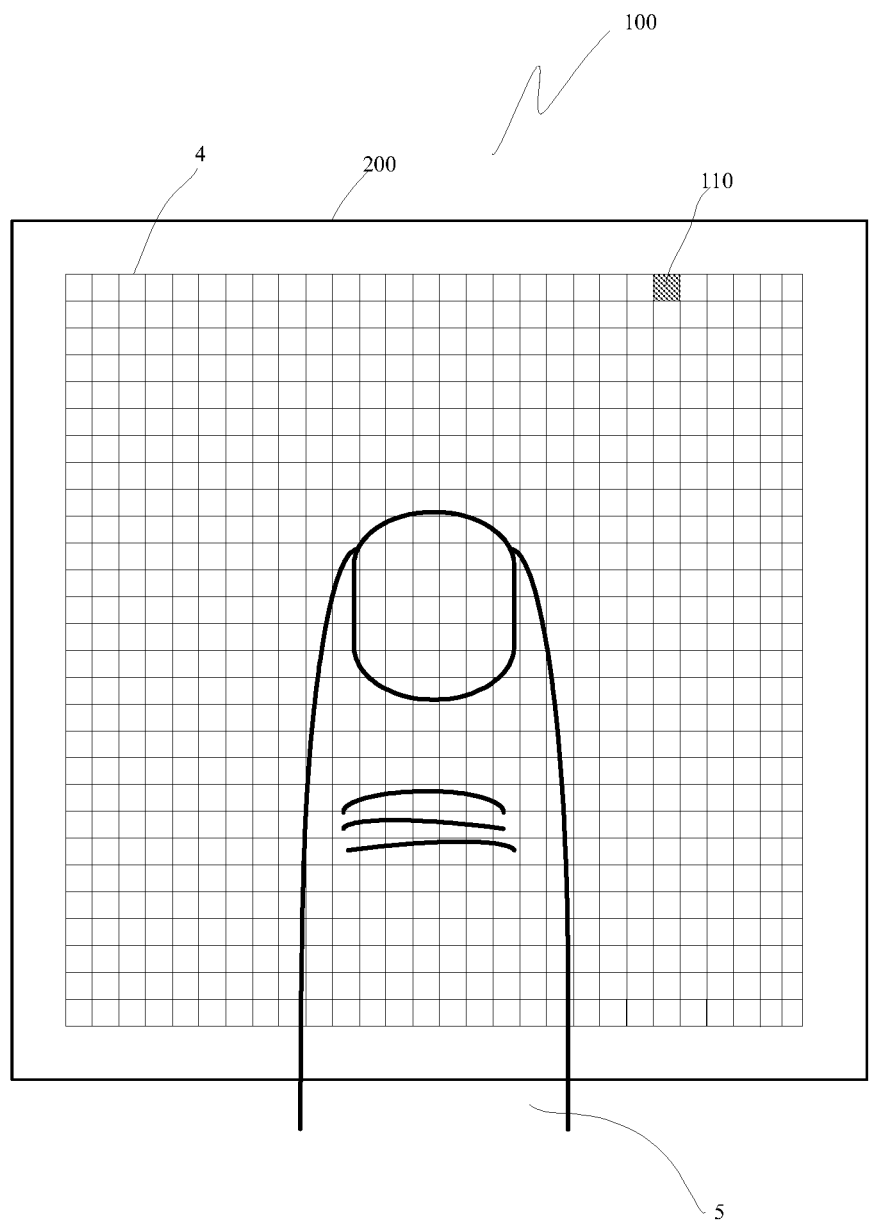
FIG. 2 is a schematic diagram of a capacitance detecting device for fingerprint identification according to an embodiment of the present disclosure.

In other words, in some embodiments, as shown in FIG. 2, the plurality of detecting units 110 can be arranged into a two-dimensional detecting array 4, and the conductive border 200 can surround the detecting array 4 and can provide the signal via the finger 5 when fingerprint is detected. When the finger 5 is placed on the detecting screen 100, the conductive border 200 is electrically connected with the finger 5, provides a reference signal via the finger 5 and completes the collection of the pattern of the finger together with the detecting array 4. The magnitude of the sensing capacitance $C_f$ formed between the top conductive layer (i.e. the first conductive layer 111) of each detecting unit 110 and the finger 5 represents the characteristic of the peak or the valley of the pattern, and thus the sensing capacitances $C_f$ formed between the plurality of detecting units 110 of the detecting array 4 and the finger 5 represent the fingerprint characteristic.

In some embodiments, as shown in FIG. 4, each detecting unit 110 further includes a fifth conductive layer 115, which is formed between the second conductive layer 112 and the third conductive layer 113 and is used as an isolative layer between the second conductive layer 112 and the third conductive layer 113. In some embodiments, the fifth conductive layer 115 is grounded or is connected with a fixed potential, and is made of a metal or polycrystalline silicon. In other words, in some embodiments, since a potential of the conductive layer 112 is not static and can be changed between different potentials, in order to avoid the influence of the change in the potential of the conductive layer 112 on other circuits, the fifth conductive layer 115 can be placed below the second conductive layer 112 as an isolative layer, in which the fifth conductive layer 115 is grounded or is connected with the fixed potential, and is made of the metal or the polycrystalline silicon.

In some embodiments, each detecting unit 110 further includes a plurality of insulating layers of formed between adjacent conductive layers of the first conductive layer 111, the second conductive layer 112, the third conductive layer 113, the fourth conductive layer 114 and the fifth conductive layer 115. Specifically, as shown in FIG. 4, the detecting unit 110 can include a first insulating layer 11 formed between the first conductive layer 111 and the second conductive layer 112, a second insulating layer 12 formed between the second conductive layer 112 and the fifth conductive layer 115, a third insulating layer 14 formed between the fifth conductive layer 115 and the third conductive layer 113, and a fifth insulating layer 15 formed between the third conductive layer 113 and the fourth conductive layer 114. Also, each detecting unit 110 further includes a layer 16, and the layer 16 can include other conductive layers configured for electrical connection, connection to other active devices or passive devices, electrical shielding, etc.

In some embodiments, the magnitude of the feedback capacitance $C_m$ which is formed between the first conductive layer 111 and the second conductive layer 112 can be regulated by adjusting the thickness of the insulating layer 11; and the magnitude of the integrating capacitance $C_i$ which is formed between the third conductive layer 113 and the fourth conductive layer 114 can be regulated by adjusting the thickness of the insulating layer 15.

In some embodiments, each detecting unit 110 further includes a protective layer, which is configured to cover the first conductive layer 111. For example, as shown in FIG. 4, the first conductive layer 111 is covered with an insulating layer 10 as the protective layer, which can be used as a package of the fingerprint sensor and provide protection for the internal detecting structure.

In some embodiments, as shown in FIG. 1, the detecting module 300 is configured to charge the sensing capacitance $C_f$ and the feedback capacitance $C_m$ at a sampling stage, to measure and control electric charges of the sensing capacitance $C_f$ and the feedback capacitance $C_m$ to transfer to the integrating capacitance $C_i$ at an integral stage, to measure a voltage variation of the integrating capacitance $C_i$ at the integral stage, and to calculate the sensing capacitance $C_f$ according to the voltage variation.

In some embodiments, as shown in FIG. 1, the detecting module 300 includes a reference voltage supplying unit 310, an amplifying unit 320, a voltage detecting unit 330 and a switching unit 340.

Specifically, the reference voltage supplying unit 310 is configured to supply a first reference voltage, a second reference voltage, a third reference voltage and a fourth reference voltage. The amplifying unit 320 is configured to amplify a voltage of the integrating capacitance $C_i$. The voltage detecting unit 330 is connected with the amplifying unit 320 and is configured to detect a voltage of the integrating capacitance $C_i$. The switching unit 340 is configured to supply the first reference voltage to the finger 5 via the conductive border 200 and supply the second reference voltage to the first conductive layer 111 and the second conductive layer 112 respectively at the sampling stage, and to supply the second reference voltage to the finger 5 via the conductive border 200 and supply the third reference voltage or the fourth reference voltage to the second conductive layer 112 at the integral stage. In some embodiments, a first input terminal of the amplifying unit 320 is connected with the fourth conductive layer 114, a second input terminal of the amplifying unit 320 is connected with the second reference voltage, and an output terminal of the amplifying unit 320 is connected with the third conductive layer 113. For example, as shown in FIG. 4, the amplifying unit 320 can be an operational amplifier 6, the first input terminal of the amplifying unit 320 can be a negative input terminal of the operational amplifier 6 and the second input terminal of the amplifying unit 320 can be a positive input terminal of the operational amplifier 6. In addition, the voltage detecting unit 330 can be a quantizer 7.

In some embodiments, as shown in FIG. 4, the detecting module 300 further includes a resetting switch S0, in which a first terminal of the resetting switch S0 is connected with the third conductive layer 113 and a second terminal of the resetting switch S0 is connected with the fourth conductive layer 114.

In one embodiment, as shown in FIG. 4, the switching unit 340 includes a first switch S1, a second switch S2, a third switch S3, a fourth switch S4 and a controller 341. A first terminal of the first switch S1 is connected with the conductive border 200, a second terminal of the first switch S1 is connected with the first reference voltage $V_{ref}$, and a third terminal of the first switch S1 is connected with the second reference voltage VCM. A first terminal of the second switch S2 is connected with the first conductive layer 111, a second terminal of the second switch S2 is connected with the first input terminal of the amplifying unit 320. A first terminal of the third switch S3 is connected with the first conductive layer 111, a second terminal of the third switch S3 is connected with the second reference voltage VCM. A first terminal of the fourth switch S4 is connected with the second conductive layer 112, second to fourth terminals of the fourth switch S4 are connected with the third reference voltage $V_{ref\_H}$, the fourth reference voltage $V_{ref\_L}$ and the second reference voltage VCM respectively. The controller 341 is configured to control the first switch S1, the second switch S2, the third switch S3 and the fourth switch S4 to switch on or off respectively.

In other words, for each detecting unit 110, the top conductive layer, i.e. the first conductive layer 111 can be used as the detecting electrode of the sensing capacitance $C_f$, and the first conductive layer 111 is connected with the negative input terminal of the operational amplifier 6 via the second switch S2 or connected with the fixed potential (i.e. the second reference voltage VCM) via the third switch S3, the positive input terminal of the operational amplifier 6 is connected with the fixed potential (i.e. the second reference voltage VCM). Therefore, by means of the virtual short characteristic of the positive input terminal and the negative input terminal of the operational amplifier 6, each detecting unit 110 can remain at a fixed potential, i.e. the second reference voltage VCM, which can eliminate the influence of parasitic capacitances.

In some embodiments, the controller 341 is connected with the voltage detecting unit 330 and is configured to supply the third reference voltage $V_{ref\_H}$ or the fourth reference voltage $V_{ref\_L}$ to the second conductive layer 112 according to an output of the voltage detecting unit 330.

In the following, each detecting unit 110 will be described in detail with reference to FIG. 3.

Figure 3:
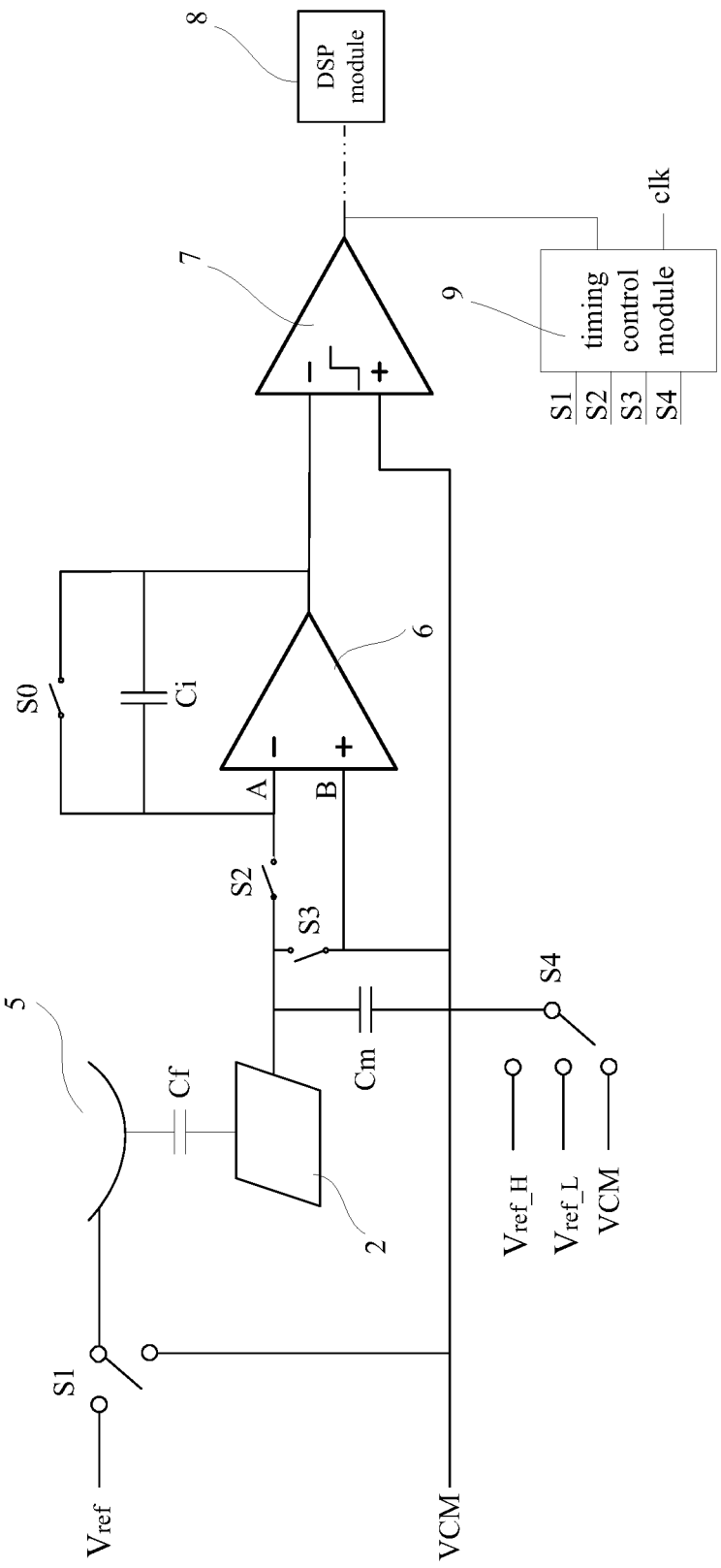
FIG. 3 is a schematic diagram of one detecting unit shown in FIG. 2 according to an embodiment of the present disclosure.

For example, as shown in FIG. 3, the top conductive layer 2 of the detecting unit 110 is the first conductive layer 111. If the sensing capacitance $C_f$ is formed between the first conductive layer 111 and the finger 5, the finger 5 can be connected with different reference voltages via the first switch S1, and the first conductive layer 111 can be connected with the negative input terminal of the operational amplifier 6 via the second switch S2 or connected with a fixed reference VCM via the third switch S3. The integrating capacitance $C_i$ is connected between the negative input terminal of the operational amplifier 6 and an output terminal of the operational amplifier 6, and the resetting switch S0 and the integrating capacitance $C_i$ are parallel to reset the integrating capacitance $C_i$. The feedback capacitance $C_m$ can complete the subtraction function of a modulator, a first terminal of the feedback capacitance $C_m$ is connected with the first conductive layer 111 and a second terminal of the feedback capacitance $C_m$ is connected with different reference voltages according to an output of the modulator. The output terminal of the operational amplifier 6 is connected with an input terminal of a quantizer 7, and the quantizer 7 completes coarse quantization of the output signal of the operational amplifier 6 in the modulation and provides the output signal of the controller 34. The controller 341 can be a timing control module 9. On the one hand, the output signal of the quantizer 7 is connected with the timing control module 9 to provide timing signals S1~S4, on the other hand, the output signal of the quantizer 7 can be used as a coarsely quantized signal to be supplied to a DSP (Digital Signal Processing) module 8 which can process the coarsely quantized signal to obtain the sensing capacitance $C_f$.

As shown in FIG. 3, the process of detecting fingerprint can include a sampling stage and an integral stage. At the sampling stage, by electrically connecting the conductive border 200 with the finger 5, the first switch S1 is connected with the first reference voltage $V_{ref}$, the second switch S2 is switched off, the third switch S3 is switched on, the fourth switch S4 is connected with the second reference voltage VCM, the amount of electric charges of the sensing capacitance $C_f$ which is formed between the first conductive layer 111 and the finger 5 can be $(V_{ref}-VCM)*C_f$. At the integral stage, the first switch S1 is connected with the second reference voltage VCM, the second switch S2 is switched on, the third switch S3 is switched off, the fourth switch S4 is connected with the third reference voltage $V_{ref\_H}$ or the fourth reference voltage $V_{ref\_L}$ according to the output of the quantizer 7. For example, if the output of the quantizer 7 is high, the fourth switch S4 is connected with the third reference voltage $V_{ref\_H}$, but if the output of the quantizer 7 is low, the fourth switch S4 is connected with the fourth reference voltage $V_{ref\_L}$. The negative input terminal A and the positive input terminal B of the operational amplifier 6 can remain at the second reference voltage VCM due to the virtual short characteristic of the input terminals of the operational amplifier 6. At this time, the voltages of two terminals of the sensing capacitance $C_f$ are equal, the electric charges (i.e. $(V_{ref}-VCM)*C_f$) of the sensing capacitance $C_f$ can be transferred to the integrating capacitance $C_i$. At the same time, the feedback capacitance $C_m$ also needs to complete the subtraction function, in which the amount of transferred electric charges of the feedback capacitance $C_m$ may be $(V_{ref\_H/L}-VCM)*C_m$, so the charge variation of the integrating capacitance $C_i$ may be $(V_{ref}-VCM)*C_f - (V_{ref\_H/L}-VCM)*C_m$. Thus, after a complete course of the sampling stage and the integral stage, the voltage variation of the output of the operational amplifier 6 may be $\Delta V = [(V_{ref}-VCM)*C_f-(V_{ref\_H/L}-VCM)*C_m]/C_i$, in which $\Delta V$ represents the voltage variation. As can be seen, among the related items about $\Delta V$, only $C_f$ is a variable, so $\Delta V$ is a function of $C_f$, i.e. the output from the quantizer 7 is a function of $C_f$, thereby achieving the detection of $C_f$. It should be noted that the quantizer 7 in FIG. 3 can be achieved by known types of comparators, the timing signals provided by the timing control module 9 can be used to complete sampling and integral controlling of the substrate, so the timing signals are usually not overlapping timing signals. The coarsely quantized signal can be outputted by the quantizer 7 after modulating the sensing capacitance $C_f$, and needs to be processed by the DSP module 8 to get a digitization result of the sensing capacitance $C_f$.

It should be noted that at the sampling stage and the integrating stage of the detecting module 300, the detecting can be achieved by the operational amplifier 6 which is fabricated based on CMOS technology. The resetting switch S0 connected between the negative input terminal and the output terminal of the operational amplifier 6 can be used to keep the input terminals of the operational amplifier 6 at a DC level, in order to ensure that the operational amplifier 6 operates properly. The resetting switch S0 is very effective for achieving that the operational amplifier 6 is in a normal state of the bias voltage. If the positive input terminal of the operational amplifier 6 is fixed at the potential of the VCM, based on the virtual short characteristic, the negative input terminal of the operational amplifier 6 is also fixed at the potential of the VCM. Thus, it is possible to ensure the normal operation at the sampling stage and the integration stage.

It is further noted that each detecting unit 110 can include an operational amplifier 6 independently to achieve the modulation function for the input signal. In order to reduce the area of the whole circuit, the operational amplifier 6 must have a simple structure. Since oversampling is used, the requirement for the performance of the operational amplifier 6 must be lower compared to other detecting technologies, so it is easier to simplify the operational amplifier 6.

In summary, in the over-sampling detection of the switching capacitance, by maintaining the input voltage signal or the input current signal at the fixed value and using the magnitude of the sampling capacitance as a variable, it is possible to detect the relative change amount of this capacitance. Since the fingerprint detecting is based on capacitance detecting, by using this principle, the quantifying of the fingerprint capacitance can be achieved directly without a separate front-end detecting circuit, so the circuit structure is simplified, the noise of the circuit is reduced, and thereby the accuracy of the fingerprint detecting is increased.

With the capacitance detecting device for fingerprint identification according to embodiments of the present disclosure, the detecting module charges the sensing capacitance and the feedback capacitance at the sampling stage, and measures and controls electric charges of the sensing capacitance and the feedback capacitance to transfer to the integrating capacitance at the integral stage, and then measures the voltage variation of the integrating capacitance at the integral stage and calculates the sensing capacitance according to the voltage variation to achieve fingerprint identification. Therefore, the capacitance detecting device for fingerprint identification according to embodiments of the present disclosure at least has the following advantages: (1) by changing the fingerprint signal to the digital capacitance signal to avoid a general front-end detecting circuit, the circuit scale is significantly reduced, and since the smaller the circuit scale is, the lower the noise and power consumption are, the capacitance detecting device for fingerprint identification has the higher detecting accuracy and the lower power consumption; (2) by keeping parasitic capacitances at a fixed potential via the operational amplifier, parasitic capacitances in the circuit does not affect the charge transferring, so it is possible to eliminate the effects of parasitic capacitances on the input signal and to eliminate the influence of the switching device on the detection accuracy, and thereby the detection accuracy is increased.

In addition, embodiments of the present disclosure also provide a fingerprint identification apparatus, which includes the capacitance detecting device for fingerprint identification according to the above-described embodiments of the present disclosure.

With the fingerprint identification apparatus according to embodiments of the present disclosure, the detecting module charges the sensing capacitance and the feedback capacitance at the sampling stage, and measures and controls electric charges of the sensing capacitance and the feedback capacitance to transfer to the integrating capacitance at the integral stage, and then measures the voltage variation of the integrating capacitance at the integral stage and calculates the sensing capacitance according to the voltage variation to achieve fingerprint identification. Therefore, the fingerprint identification apparatus according to embodiments of the present disclosure at least has the following advantages: (1) by changing the fingerprint signal to the digital capacitance signal to avoid a general front-end detecting circuit, the circuit scale is significantly reduced, and since the smaller the circuit scale is, the lower the noise and power consumption are, the fingerprint identification apparatus has the higher detecting accuracy and the lower power consumption; (2) by keeping parasitic capacitances at a fixed potential via the operational amplifier, parasitic capacitances in the circuit does not affect the charge transferring, so it is possible to eliminate the effects of parasitic capacitances on the input signal and to eliminate the influence of the switching device on the detection accuracy, and thereby the detection accuracy is increased.

Any process or method described in the flowing diagram or other means may be understood as a module, segment or portion including one or more executable instruction codes of the procedures configured to achieve a certain logic function or process, and the preferred embodiments of the present disclosure include other performances, in which the performance may be achieved in other orders instead of the order shown or discussed, such as in a almost simultaneous way or in an opposite order, which should be appreciated by those having ordinary skills in the art to which embodiments of the present disclosure belong.

The logic and/or procedures indicated in the flowing diagram or described in other means herein, such as a constant sequence table of the executable code for performing a logical function, may be implemented in any computer readable storage medium so as to be adopted by the code execution system, the device or the equipment (such a system based on the computer, a system including a processor or other systems fetching codes from the code execution system, the device and the equipment, and executing the codes) or to be combined with the code execution system, the device or the equipment to be used. With respect to the description of the present invention, "the computer readable storage medium" may include any device including, storing, communicating, propagating or transmitting program so as to be used by the code execution system, the device and the equipment or to be combined with the code execution system, the device or the equipment to be used. The computer readable medium includes specific examples (a non-exhaustive list): the connecting portion (electronic device) having one or more arrangements of wire, the portable computer disc cartridge (a magnetic device), the random access memory (RAM), the read only memory (ROM), the electrically programmable read only memory (EPROMM or the flash memory), the optical fiber device and the compact disk read only memory (CDROM). In addition, the computer readable storage medium even may be papers or other proper medium printed with program, as the papers or the proper medium may be optically scanned, then edited, interpreted or treated in other ways if necessary to obtain the program electronically which may be stored in the computer memory.

It should be understood that, each part of the present invention may be implemented by the hardware, software, firmware or the combination thereof. In the above embodiments of the present invention, the plurality of procedures or methods may be implemented by the software or hardware stored in the computer memory and executed by the proper code execution system. For example, if the plurality of procedures or methods is to be implemented by the hardware, like in another embodiment of the present invention, any one of the following known technologies or the combination thereof may be used, such as discrete logic circuits having logic gates for implementing various logic functions upon an application of one or more data signals, application specific integrated circuits having appropriate logic gates, programmable gate arrays (PGA), field programmable gate arrays (FPGA).

It can be understood by those having the ordinary skills in the related art that all or part of the steps in the method of the above embodiments can be implemented by instructing related hardware via programs, the program may be stored in a computer readable storage medium, and the program includes one step or combinations of the steps of the method when the program is executed.

In addition, each functional unit in the present disclosure may be integrated in one progressing module, or each functional unit exists as an independent unit, or two or more functional units may be integrated in one module. The integrated module can be embodied in hardware, or software. If the integrated module is embodied in software and sold or used as an independent product, it can be stored in the computer readable storage medium.

The computer readable storage medium may be, but is not limited to, read-only memories, magnetic disks, or optical disks.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A capacitance detecting device for fingerprint identification, comprising:
    a conductive border;
    a detecting screen, comprising:
        a plurality of detectors, wherein each detector comprises:
            a first conductive layer, a second conductive layer, a third conductive layer and a fourth conductive layer, wherein a sensing capacitance is formed between the first conductive layer and a finger in contact with the detecting screen, a feedback capacitance is formed between the first conductive layer and the second conductive layer, an integrating capacitance is formed between the third conductive layer and the fourth conductive layer, and the finger is electrically connected with the conductive border when the finger is in contact with the detecting screen; and
    a detecting module, configured to:
        charge the sensing capacitance and the feedback capacitance at a sampling stage;
        control electric charges of the sensing capacitance and electric charges of the feedback capacitance to transfer to the integrating capacitance at an integral stage;
        measure a voltage variation of the integrating capacitance at the integral stage; and
        calculate the sensing capacitance according to the voltage variation.

2. The device according to claim 1, wherein the first conductive layer, the second conductive layer, the third conductive layer and the fourth conductive layer are parallel to a detecting plane of the detecting screen respectively.

3. The device according to claim 1, wherein each detector further comprises:
    a fifth conductive layer formed between the second conductive layer and the third conductive layer, wherein the fifth conductive layer is an isolative layer between the second conductive layer and the third conductive layer.

4. The device according to claim 3, wherein the fifth conductive layer is grounded or connected with a fixed potential, and is made of a metal or polycrystalline silicon.

5. The device according to claim 1, wherein each detector further comprises:
    a plurality of insulating layers formed between adjacent conductive layers of the first conductive layer, the second conductive layer, the third conductive layer, the fourth conductive layer and the fifth conductive layer.

6. The device according to claim 1, wherein each detector further comprises:
    a protective layer, configured to cover the first conductive layer.

7. The device according to claim 1, wherein the detecting module comprises:
    a reference voltage supplying unit, configured to supply a first reference voltage, a second reference voltage, a third reference voltage and a fourth reference voltage;
    an amplifying unit, configured to amplify a voltage of the integrating capacitance, wherein a first input terminal of the amplifying unit is connected with the fourth conductive layer, a second input terminal of the amplifying unit is connected with the second reference voltage, and an output terminal of the amplifying unit is connected with the third conductive layer;

a voltage detecting unit, connected with the amplifying unit and configured to detect a voltage of the integrating capacitance;

a switching unit, configured to supply the first reference voltage to the finger via the conductive border and supply the second reference voltage to the first conductive layer and the second conductive layer respectively at the sampling stage, and to supply the second reference voltage to the finger via the conductive border and supply the third reference voltage or the fourth reference voltage to the second conductive layer at the integral stage.

8. The device according to claim 7, wherein the detecting module further comprises:
   a resetting switch, wherein a first terminal of the resetting switch is connected with the third conductive layer and a second terminal of the resetting switch is connected with the fourth conductive layer.

9. The device according to claim 7, wherein the switching unit comprises:
   a first switch, wherein a first terminal of the first switch is connected with the conductive border, a second terminal of the first switch is connected with the first reference voltage, a third terminal of the first switch is connected with the second reference voltage;
   a second switch, wherein a first terminal of the second switch is connected with the first conductive layer, a second terminal of the second switch is connected with the first input terminal of the amplifying unit;
   a third switch, wherein a first terminal of the third switch is connected with the first conductive layer, a second terminal of the second switch is connected with the second reference voltage;
   a fourth switch, wherein a first terminal of the fourth switch is connected with the second conductive layer, second to fourth terminals of the fourth switch are connected with the third reference voltage, the fourth reference voltage and the second reference voltage respectively; and
   a controller, configured to control the first switch, the second switch, the third switch and the fourth switch.

10. The device according to claim 9, wherein the controller is connected with the voltage detecting unit and configured to supply the third reference voltage or the fourth reference voltage to the second conductive layer according to an output of the voltage detecting unit.

11. A fingerprint identification apparatus, comprising:
   a conductive border;
   a detecting screen, comprising:
      a plurality of detectors, wherein each detector comprises:
         a first conductive layer, a second conductive layer, a third conductive layer and a fourth conductive layer, wherein a sensing capacitance is formed between the first conductive layer and a finger in contact with the detecting screen, a feedback capacitance is formed between the first conductive layer and the second conductive layer, an integrating capacitance is formed between the third conductive layer and the fourth conductive layer, and the finger is electrically connected with the conductive border when the finger is in contact with the detecting screen; and
   a detecting module, configured to:
      charge the sensing capacitance and the feedback capacitance at a sampling stage;
      control electric charges of the sensing capacitance and electric charges of the feedback capacitance to transfer to the integrating capacitance at an integral stage;
      measure a voltage variation of the integrating capacitance at the integral stage; and
      calculate the sensing capacitance according to the voltage variation.

* * * * *